United States Patent [19]
Kuroda et al.

[11] Patent Number: 5,940,206
[45] Date of Patent: Aug. 17, 1999

[54] OPTICAL PARAMETRIC DIFFUSER

[75] Inventors: Kenji Kuroda, Hatano; Hideki Takakura, Atsugi, both of Japan

[73] Assignee: Teratec Corporation, Japan

[21] Appl. No.: 08/813,907

[22] Filed: Mar. 7, 1997

[30] Foreign Application Priority Data

Jun. 24, 1996 [JP] Japan .................................. 8-162687

[51] Int. Cl.⁶ ...................................................... G02F 1/39
[52] U.S. Cl. .......................................... 359/330; 359/326
[58] Field of Search .................. 359/326–332; 385/122; 372/21, 22

[56] References Cited

U.S. PATENT DOCUMENTS

| | | | |
|---|---|---|---|
| 3,675,039 | 7/1972 | Boyd et al. | 359/330 |
| 4,528,464 | 7/1985 | Chemla et al. | 359/326 |
| 5,504,616 | 4/1996 | Shinozaki et al. | 359/326 |

FOREIGN PATENT DOCUMENTS 426239 2/1995 European Pat. Off. .
6283824 10/1994 Japan .

OTHER PUBLICATIONS

D'Ottavi et al, Inst. of Electrical & Electronics Engineers, vol. 12, pp. 189–190, May 1993, Paper Q Th A5.

Bava et al, IEEE Proceedings, vol. 143 No. 2, pp. 119–125, Apr. 1996.

*Primary Examiner*—John D. Lee
*Attorney, Agent, or Firm*—Lorusso & Loud

[57] ABSTRACT

An optical parametric diffuser is provided with an optical mixer which receives inputs of a probe light of a wavelength $\lambda_1$ and a pumping light of a wavelength $\lambda_2$, multiplexes them, and generates an output signal light including a wavelength $\lambda_5$ which is apart from the pumping light wavelength on the opposite side of the probe light wavelength by $n\Delta\lambda$ ($\Delta\lambda=|\lambda_1-\lambda_2|$, $n\geq 2$). The signal of a wavelength $\lambda_5$ is then extracted by a band-pass filter. The optical mixer is made to have a peak in output signal generation efficiency at the wavelength $\lambda_5$ so that an output light beam of the wavelength $\lambda_5$ can be obtained from the probe light and the pumping light.

5 Claims, 10 Drawing Sheets

ENERGY BAND DIAGRAM

OPTICAL PARAMETRIC DIFFUSER

BACKGROUND OF THE INVENTION

1. Field of the Invention

This invention relates to a very high speed signal processing, more specifically to an optical parametric diffuser for performing wavelength conversion at very high speeds.

2. Description of the Prior Art

A conventional wavelength conversion device will be described first.

Figure 12:
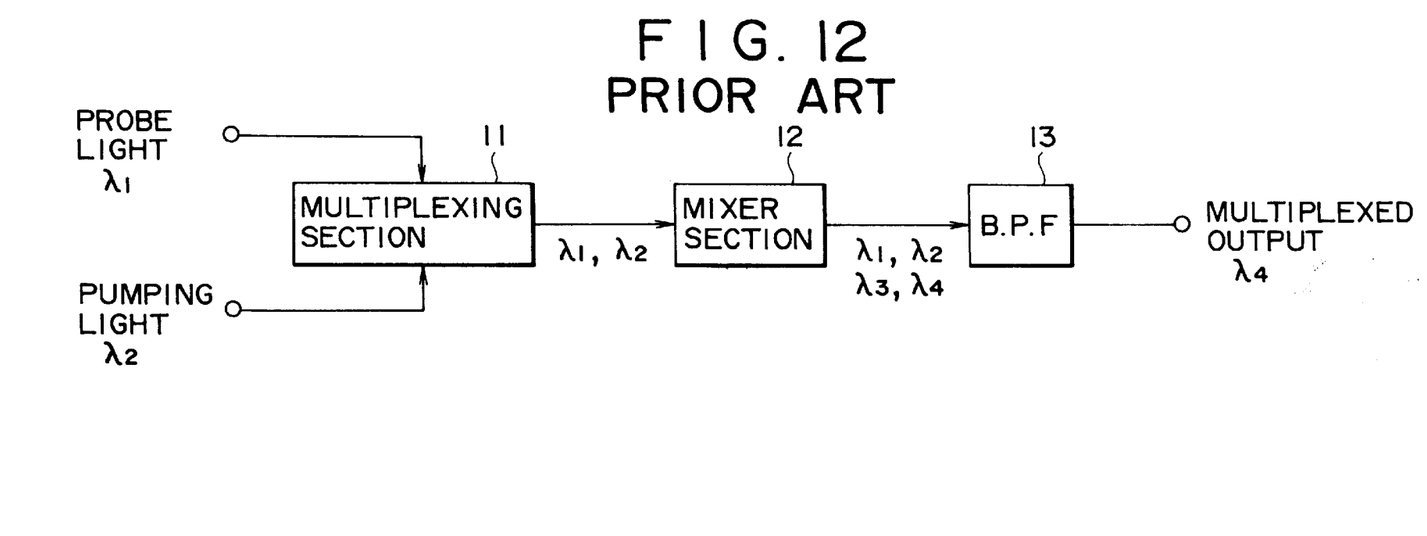
FIG. 12 is a block diagram showing a constitution of a conventional wavelength conversion device.

FIG. 12 is a block diagram for describing a conventional example. In the following description, it is assumed that the symbols, $\lambda_1, \lambda_2, \lambda_3, \ldots$ not only denote wavelengths but also signals of those wavelengths.

Figure 3A:
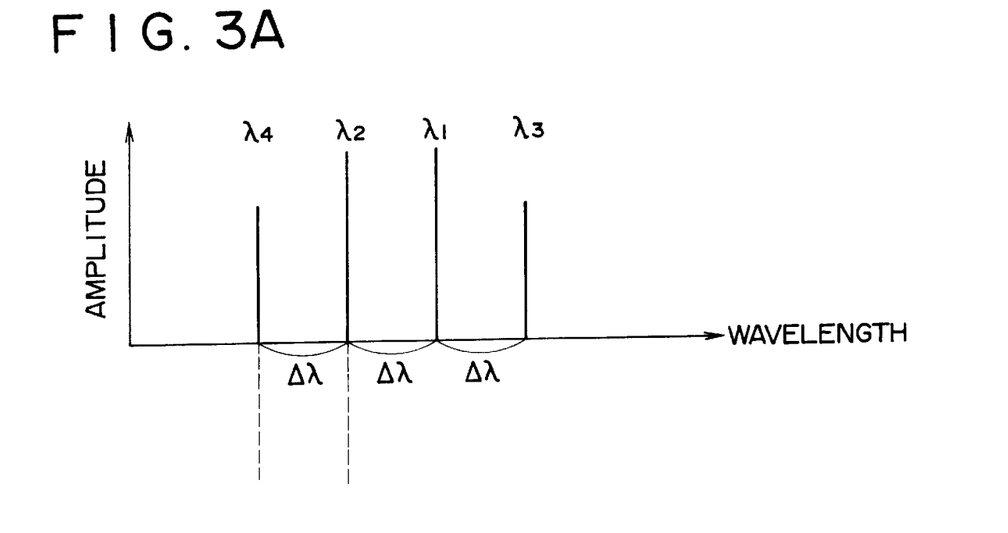
FIGS. 3(a) and 3(b) show spectrum for describing functions and actions of a conventional example shown in FIG. 12.
Figure 3B:
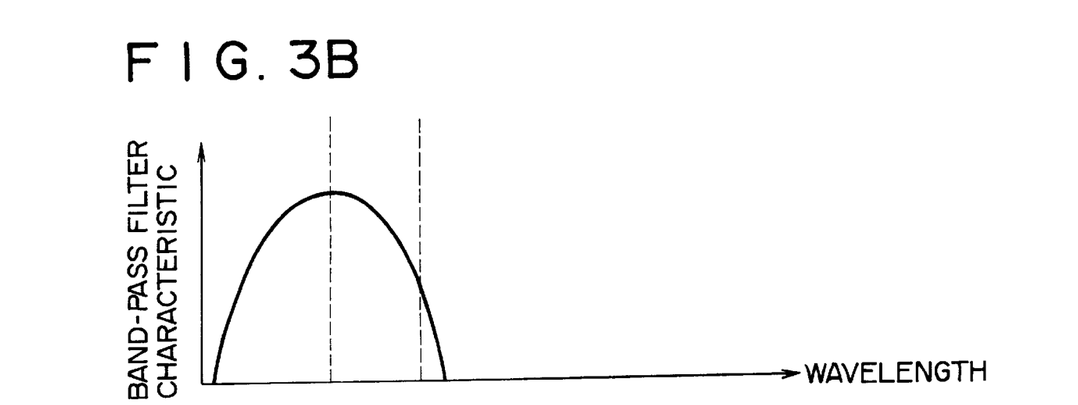

The figure shows a multiplexing section 11 for multiplexing two input signals $\lambda_1, \lambda_2$ and outputting their multiplexed waves $\lambda_1, \lambda_2$. A mixer section 12 uses a device such as an optical semiconductor amplifier or a differential frequency generator using a KTP crystal. The mixer section 12 receives inputs of multiplexing signals $\lambda_1, \lambda_2$, mixes them, and outputs signals of wavelengths $\lambda_1, \lambda_2$, and $\lambda_3, \lambda_4$ as shown in FIGS. 3(a) and 3(b). The signals of the wavelengths $\lambda_3, \lambda_4$ are multiplexed waves generated by nonlinear optical effect at wavelengths distant from the input wavelengths $\lambda_1, \lambda_2$ by the difference $\Delta\lambda$ ($\Delta\lambda = |\lambda_1 - \lambda_2|$) between the two wavelengths. A band-pass filter (B. P.F.) 13 as shown in FIGS. 3(a) and 3(b) has a passage band wavelength of $\lambda_4$.

Function of the conventional wavelength conversion device shown in FIG. 12 will be described in reference to FIGS. 3(a), 3(b), 4(a)–4(d) and 5(a)–5(c).

A probe light of a wavelength $\lambda_1$ and a pumping light of a wavelength $\lambda_2$ are inputted to the multiplexing section 11. The pumping light is for increasing the nonlinear optical effect. The probe light is a reference light. The multiplexing section 11 multiplexes the two input signals and outputs a multiplexed wave signal to the mixer section 12.

Figure 5A:
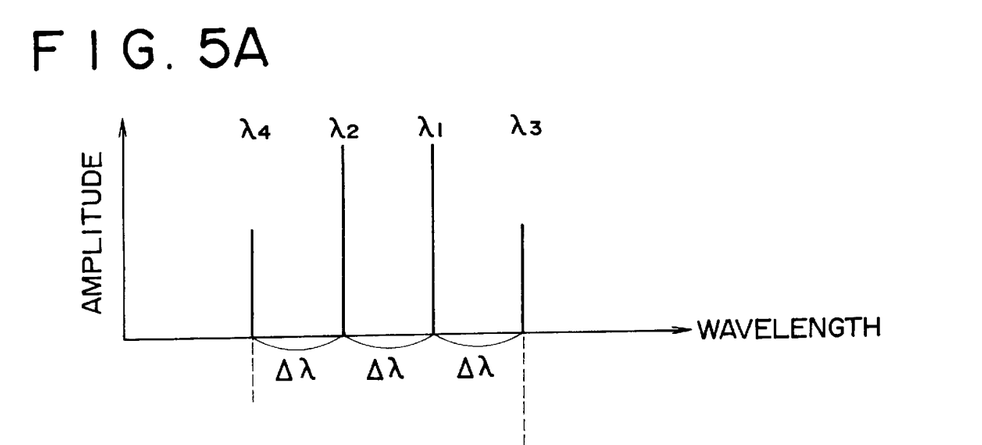
FIGS. 5(a)–5(c) show characteristics and output wave spectrum of a conventional mixer.

When the multiplexed wave signal is inputted to the mixer section 12, the mixer section 12, as shown in FIG. 5(a), with nonlinear optical effect, outputs multiplexed wave signals of wavelengths $\lambda_3, \lambda_4$ distant by $\Delta\lambda$ from the input signals $\lambda_1, \lambda_2$. Here, as shown in FIG. 5(c), while multiplexed waves of wavelengths $\lambda_5, \lambda_6$ respectively distant by $2\Delta\lambda$ from the wavelengths of the input signals $\lambda_1, \lambda_2$ are produced, since the gain of the mixer section 12 increases in the vicinity of the wavelengths $\lambda_1, \lambda_2$, and decreases in the vicinity of the wavelengths $\lambda_5, \lambda_6$, the multiplexed wave components of the wavelengths $\lambda_5, \lambda_6$ are buried below the noise level as shown in FIG. 5(c) and cannot be taken out as signals.

The band-pass filter 13 has its passage band wavelength at $\lambda_4$ which is distant by a differential wavelength $\Delta\lambda$ from the pumping light wavelength $\lambda_2$ on the opposite side of the probe light wavelength $\lambda_1$.

In this way, the probe light signal of the wavelength $\lambda_1$ is converted to the output light signal of the wavelength $\lambda_4$.

Conventional mixers for wavelength conversion include those described below.

First, a mixer using an optical semiconductor amplifier will be described.

Inputting two input signals of wavelengths $\lambda_1, \lambda_2$, outputs of wavelengths $\lambda_3, \lambda_4$ are produced which are distant by the differential wavelength $\Delta\lambda = |\lambda_1 - \lambda_2|$ from the input signals on both sides of the input signals.

Here, while either $\lambda_3$ or $\lambda_4$ may be used as the mixer output, since the wavelength is not so distant from that of the input signal, even if it is filtered with a band-pass filter of the passage band $\lambda_4$ as shown in FIG. 3(b), the signals $\lambda_1, \lambda_2$ are not easy to cut off.

Furthermore, the gain characteristic peak of the optical semiconductor amplifier is in the vicinity of the two input wavelengths $\lambda_1, \lambda_2$ and the gain is very low in the vicinity of the output signal wavelength $\lambda_4$. Therefore, conversion efficiency (output signal to input signal) is very low ($10^{-4}$ or less).

Next, a mixer using a KTP crystal will be described.

Figure 4A:
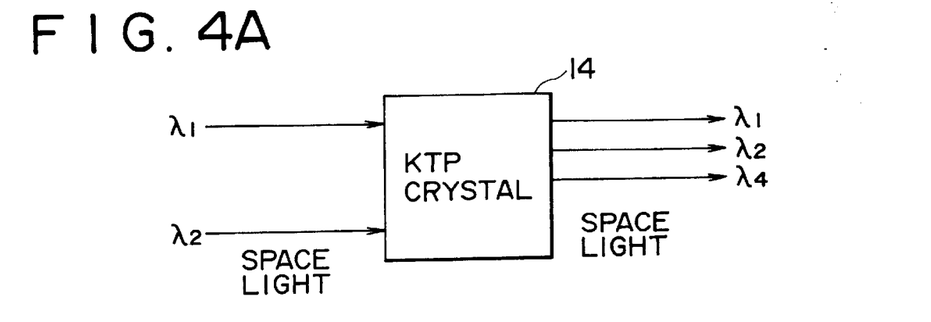
FIGS. 4(a)–4(d) show a block diagram and illustrations for describing functions and actions of a conventional example using a KTP crystal.

As shown in FIG. 4(a), when two input signals $\lambda_1, \lambda_2$ as spatial light beams are inputted to a KTP crystal 14, a wavelength-converted output signal comes out as a spatial light beam either in the form of a sum frequency wave, differential frequency wave, or second harmonic wave.

FIGS. 4(a)–4(d) show relationship between the input wavelength and output wavelength (frequency).

Figure 4B:
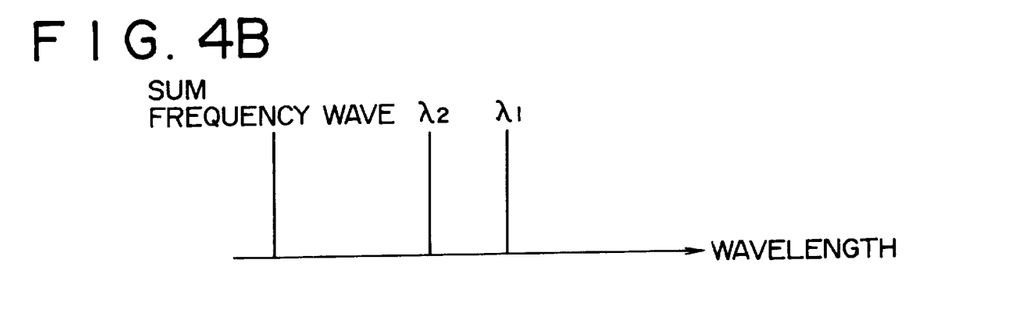

FIG. 4(b) shows the case in which the frequency of the output signal is the sum of the frequencies of the two input signals at wavelengths $\lambda_1, \lambda_2$.

Figure 4C:
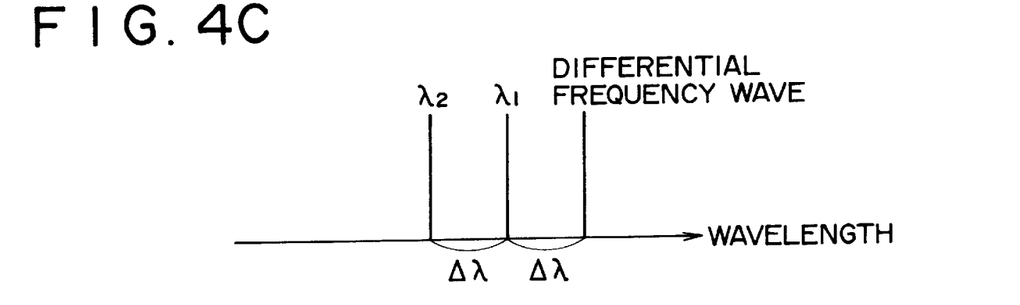

FIG. 4(c) shows the case in which the frequency of the output signal is the difference between the frequencies of the two input signals at wavelengths $\lambda_1, \lambda_2$.

Figure 4D:
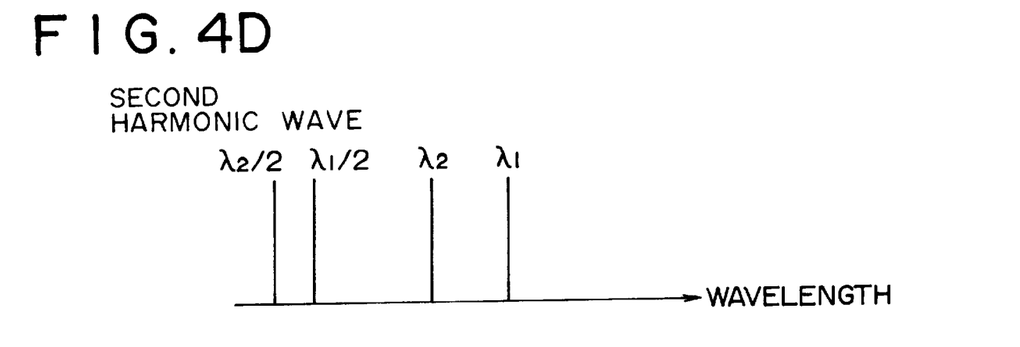

FIG. 4(d) shows the case in which the wavelengths of the output signals are respectively half the two input signal wavelengths by cutting off the input waves.

When the KTP crystal is used, the process using the spatial light beam requires a certain size and makes installation less easy. Furthermore, with the differential frequency generation, like the optical semiconductor amplifier, since the wavelengths of input and output signals are not largely different from each other, it is less easy to cut off the input signal with a filter.

Furthermore, nonlinear optical effect is not great and therefore the amount of the output signal is small. Therefore, conversion efficiency (output signal to input signal) is very low ($10^{-5}$ or less).

As described above, conventionally, when the probe light of the wavelength $\lambda_1$ and the pumping light of the wavelength $\lambda_2$ are inputted to obtain the output light of the wavelength $\lambda_4$ which is apart from $\lambda_2$ by $\Delta\lambda = |\lambda_1 - \lambda_2|$, if the $\Delta\lambda$ is small, even if a band-pass filter is used, the input wave cannot be removed effectively and the output signal cannot be obtained efficiently.

When the conventional wavelength conversion is applied to the measurement of the probe light of the wavelength $\lambda_1$, a pumping light of the wavelength $\lambda_2$ is used to produce an output signal which is apart by the differential wavelength $\Delta\lambda$, and the output signal is measured. A disadvantage in that case is that, when the two input wavelengths $\lambda_1, \lambda_2$ are close to the wavelength $\lambda_4$, the input wave component contained in the output cannot be completely cut off and the property of the probe light cannot be known accurately.

Since the conventional mixer using the optical semiconductor amplifier or the KTP differential frequency generator is low in efficiency, levels of the pumping light and the probe light must be raised. Furthermore, since the wavelengths of the input and output waves are close to each other, it is difficult to cut off the input wave with a filter. Another problem is that, in order to obtain a large output signal, a large input signal is required.

On the other hand, it is easy to filter and cut off the input signal with a mixer using KTP sum frequency generation or KTP second harmonic wave generation, in which the output wavelength is separated from the input wavelength band.

However, such a mixer must handle spatial light, cannot be made compact in size, is very low in efficiency, and therefore is not suitable for practical use.

Figure 5B:
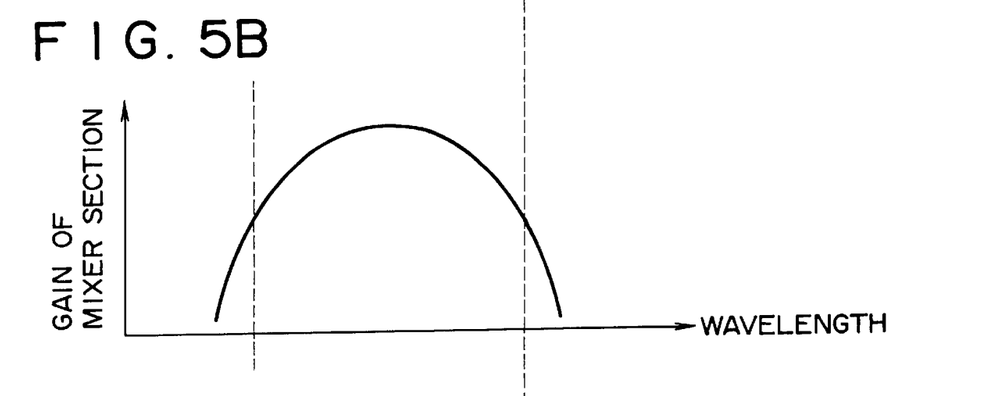
Figure 5C:
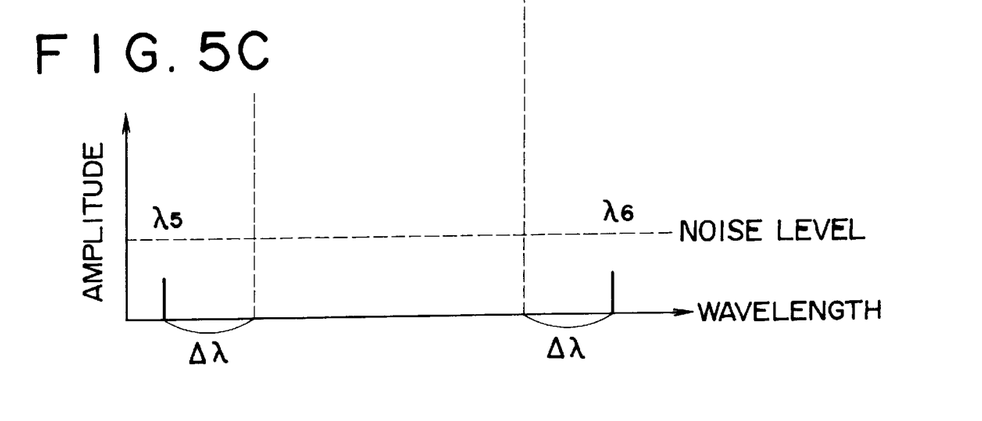

Furthermore, with the conventional mixer using the optical semiconductor amplifier, the peak of gain is made to agree with the input wavelengths $\lambda_1$, $\lambda_2$ as shown in FIG. 5(b), the input signals are mixed and amplified to obtain an output by nonlinear optical effect at a wavelength which is apart by a differential wavelength $\Delta\lambda=|\lambda_1-\lambda_2|$. With this wavelength characteristic, since the peak of gain is near the input wavelength, the more apart from the input wavelength, the lower the gain, and the nonlinear optical effect is less likely to occur. As a result, the output signal of $\lambda_5$ occurring at a wavelength apart by $n\Delta\lambda$ (n is any integer not less than 2) is buried below the noise level and cannot be utilized.

SUMMARY OF THE INVENTION

The present invention provides an optical parametric diffuser comprising:

a multiplexing section for receiving a probe light of a wavelength $\lambda_1$ and a pumping light of a wavelength $\lambda_2$ and multiplexing said prove light and said pumping light;

a mixer section for receiving an output from said multiplexing section to produce a multiplexed output including a wavelength $\lambda_5$ represented by:

$$\lambda_5=(1+n)\lambda_2-n\lambda_1$$

wherein n is an integer of at least 2; and a band-pass filter for receiving an output from said mixer section and selectively outputting a multiplexed output of said wavelength $\lambda_5$.

It is an object of the invention to provide an optical parametric diffuser capable obtaining a mixer output of a wavelength $\lambda_5$ which is apart from the input wavelength by an amount n times greater than that conventionally practicable, filtering and cutting off unwanted wavelengths contained in the probe light and the pumping light even when the probe light wavelength $\lambda_1$ and the pumping light wavelength $\lambda_2$ are close to each other, and to obtain an output light of a good quality.

BRIEF DESCRIPTION OF THE DRAWINGS

Other objects, features and advantages of the present invention will become apparent from the detailed description of the invention which follows, when considered in light of the accompanying drawings, in which.

DETAILED DESCRIPTION OF THE PREFERRED EMBODIMENTS

Figure 1:
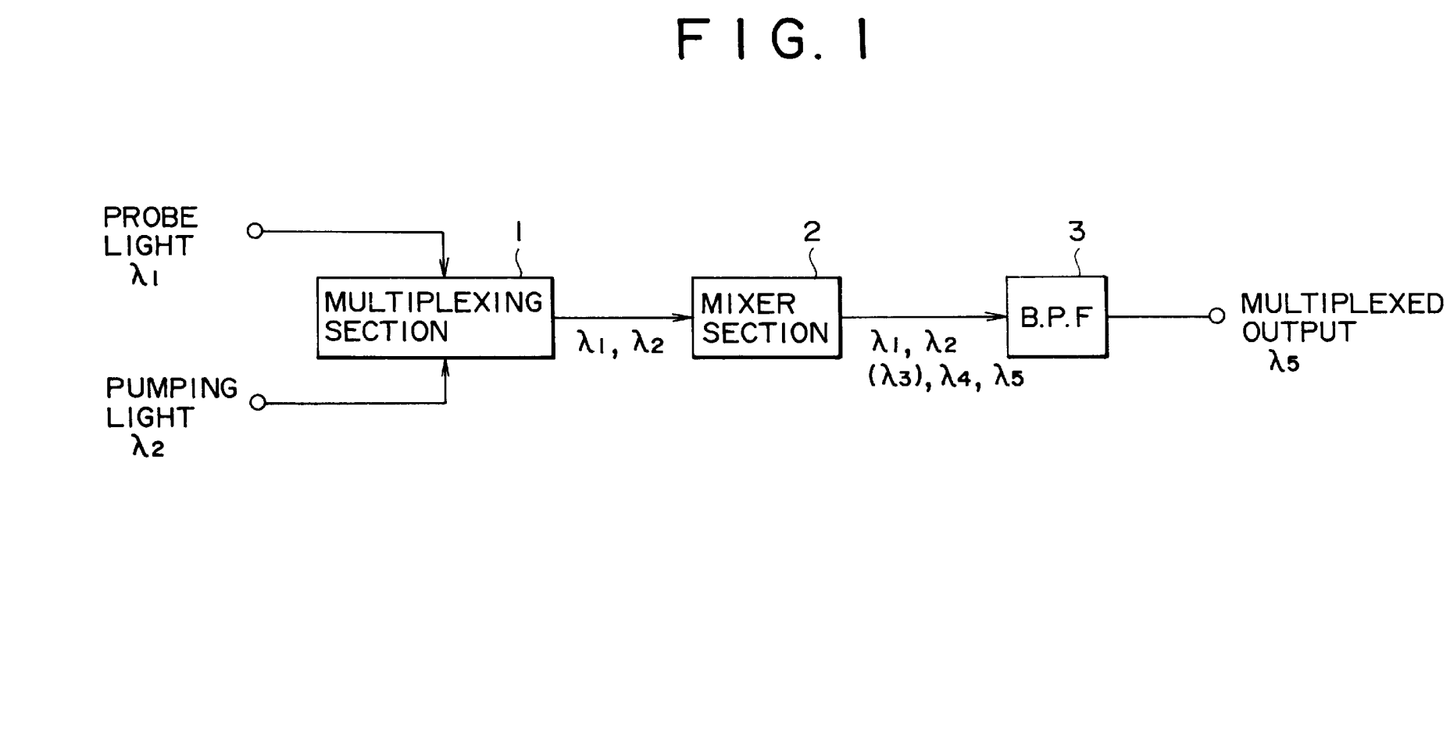
FIG. 1 is a block diagram showing a constitution of an embodiment of the invention.

FIG. 1 is a block diagram showing a constitution of an embodiment of the invention.

In reference to FIG. 1, a multiplexing section 1 is for multiplexing two input signals $\lambda_1$, $\lambda_2$ and outputting their multiplexing two input signals $\lambda_1$, $\lambda_2$ and outputting their multiplexed wave signals $\lambda_1$, $\lambda_2$. A mixer section 2 receives inputs of multiplexing signals $\lambda_1$, $\lambda_2$ from the multiplexing section 1, mixes them, amplifies them, and outputs signals of wavelengths $\lambda_1$, $\lambda_2$, and $\lambda_3$, $\lambda_4$, $\lambda_5$ as shown in FIG. 6. The signals of the wavelengths $\lambda_3$, $\lambda_4$, $\lambda_5$ are those of multiplexed wave signals generated by the nonlinear optical effect and generated at wavelengths apart from the input signal wavelengths $\lambda_1$, $\lambda_2$ by the differential wavelength $\Delta\lambda=|\lambda_1-\lambda_2|$ and $n\Delta\lambda$ (n is 2 or greater integer, hereinafter the same). A band-pass filter 3 has its pass band at the wavelength $\lambda_5$ as shown in FIG. 2(c).

Next, the function of the optical parametric diffuser (hereinafter referred to OPD for brevity) of the embodiment shown in FIG. 1 will be described in reference to FIGS. 2(a)–2(c), 6(a)–6(b) and 11.

The probe light of the wavelength $\lambda_1$ and the pumping light of the wavelength $\lambda_2$ are inputted to the multiplexing section 1. The pumping light is for starting up the nonlinear optical effect and the probe light (also called as reference light) is for converting its wavelength from now on. The multiplexing section 1 multiplexes the two input signals and outputs the multiplexed signals to the mixer section 2.

Figure 6A:
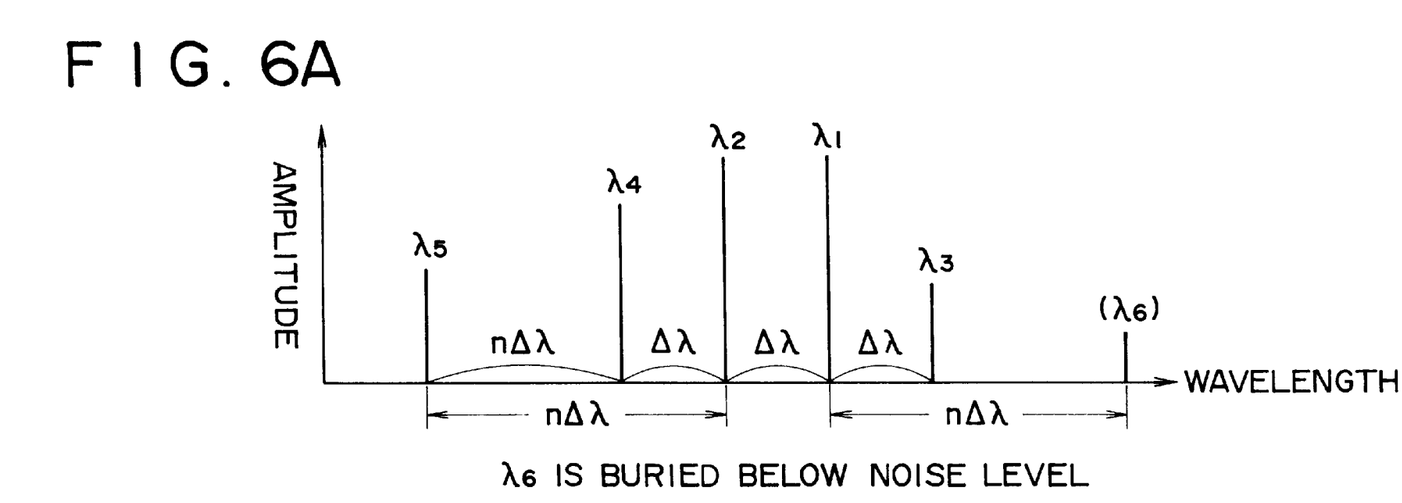
FIGS. 6(a) and 6(b) show characteristics and output wave spectrum of the mixer of the invention.

Upon receiving the multiplexed signal, the mixer section 2 produces as shown in FIG. 6(a) by the nonlinear optical effect multiplexed signals of wavelengths $\lambda_3$, $\lambda_4$ which are apart from the two input signals $\lambda_1$, $\lambda_2$ by the differential wavelength $\Delta\lambda=|\lambda_1-\lambda_2|$ and multiplexed signals $\lambda_5$, $\lambda_6$, which are apart from the two input signals by $n\Delta\lambda$.

Figure 6B:
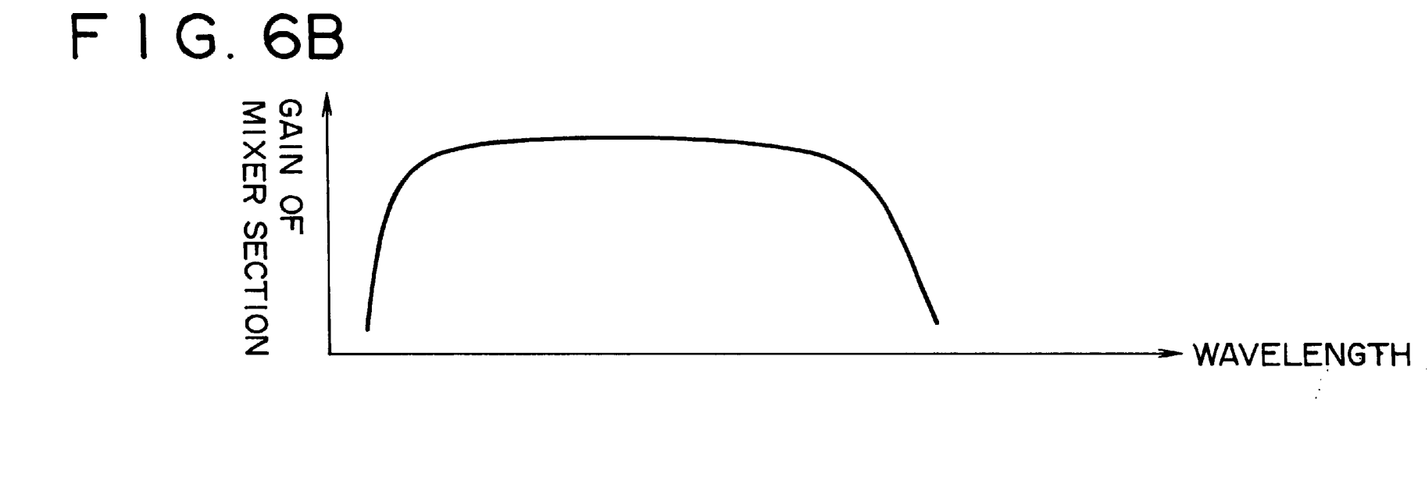

In the conventional arrangement, the gain of the mixer section has its peak in the vicinity of the wavelengths $\lambda_1$, $\lambda_2$ and the gain is small in the vicinity of the wavelengths $\lambda_5$, $\lambda_6$. Therefore, the multiplexed wave components of the wavelengths $\lambda_5$, $\lambda_6$ are buried below the noise level, and cannot be taken out as output signals. In the embodiment of the invention, however, since the peak is shifted toward the wavelength $\lambda_5$ as shown in FIG. 6(b), the wavelength $\lambda_5$ can be taken out as a multiplexed wave signal.

Furthermore, since it is possible to bring the peak of the signal generating efficiency to the wavelength $\lambda_5$, the efficiency of the mixer is extremely enhanced to produce very large output signals.

Figure 11:
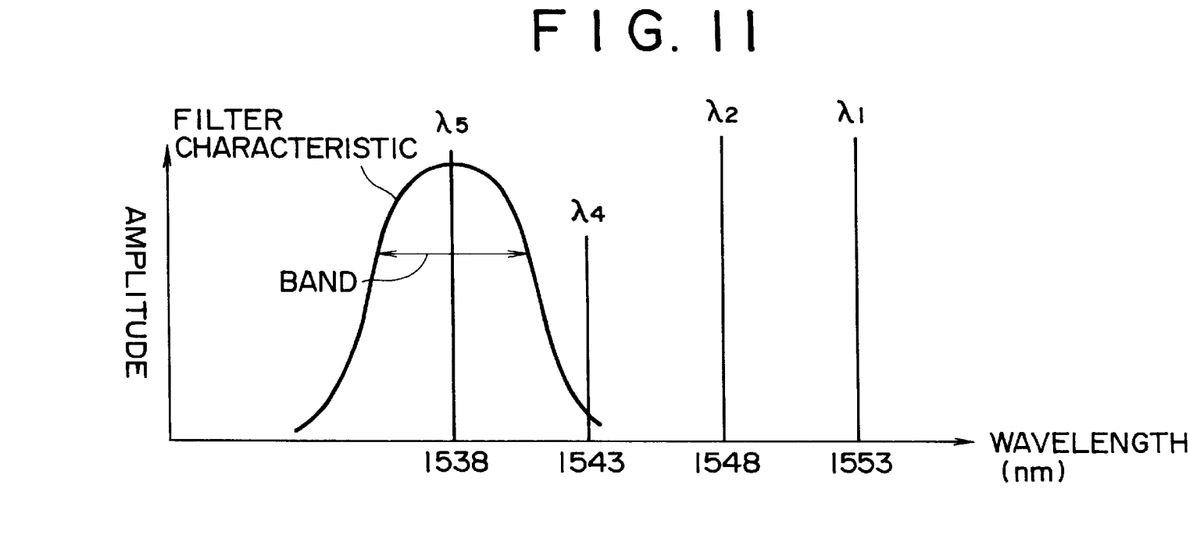
FIG. 11 shows a spectrum of the quantum well type of laser diode shown in FIG. 8 and the band-pass filter characteristic in the embodiment shown in FIG. 8.

The band-pass filter 3 as shown in FIG. 11 has its pass band at the wavelength $\lambda_5$ which is apart from the probe light wavelength $\lambda_1$ by $n\Delta\lambda$ (which is n times the wavelength difference $\Delta\lambda$ between the two input signals) on the opposite side of the pumping light wavelength $\lambda_2$.

In this way, the probe light signal of the wavelength $\lambda_1$ is converted to the output signal of the wavelength $\lambda_5$.

In this embodiment, a laser diode having either of the following two characteristics may be used as the mixer section 2.

(1) As shown in FIG. 6(b), a laser diode having a broad range, including the wavelengths of peak of output signal generating efficiency $\lambda_4$, $\lambda_5$. Although the output on the wavelength $\lambda_3$ side is small, there is no problem because only the wavelengths $\lambda_4$, $\lambda_5$ side are used.

Figure 2A:
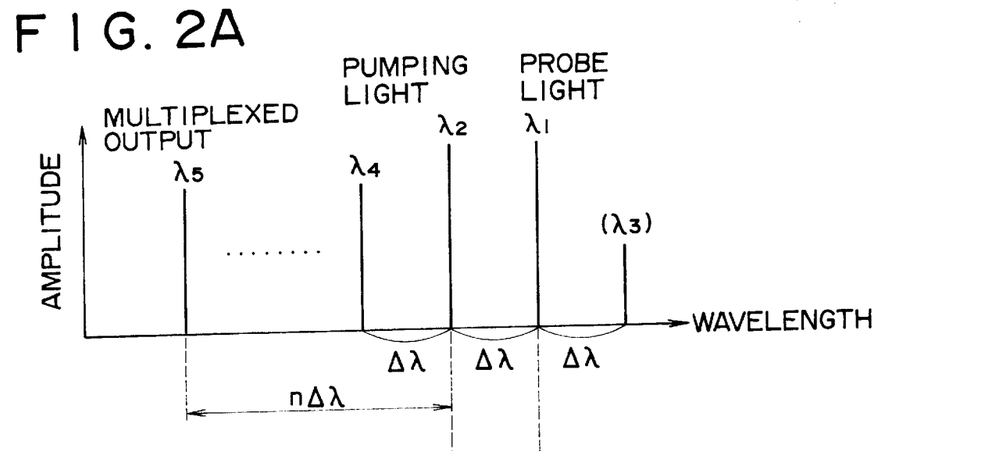
FIGS. 2(a)–2(c) show spectrum for describing functions and actions of the embodiment.
Figure 2B:
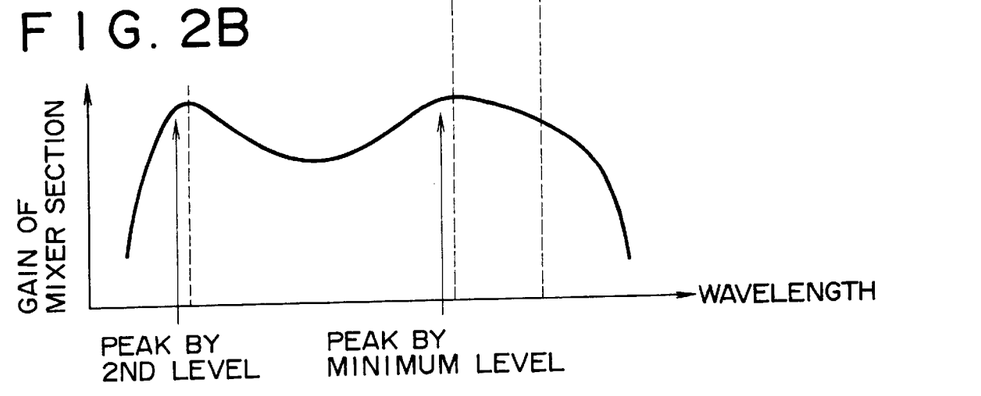
Figure 2C:
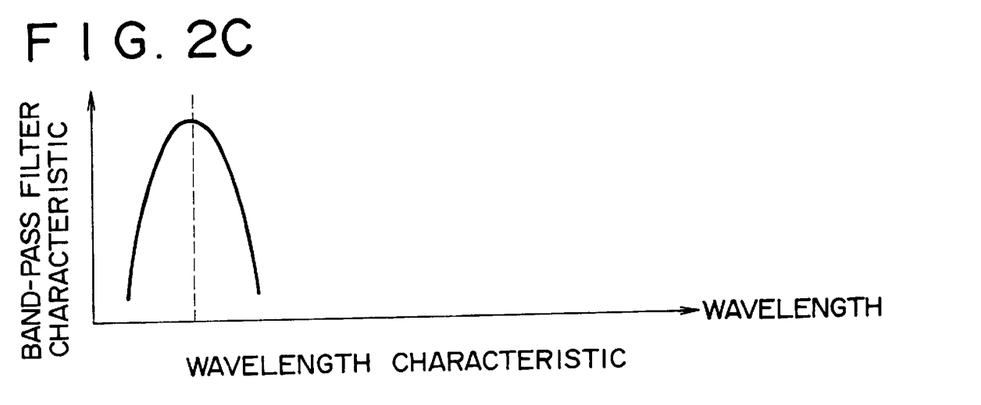

(2) As shown in FIGS. 2(a), (b), a laser diode having two peaks in its signal generating efficiency, namely at the pumping light wavelength $\lambda_2$ and at the wavelength $\lambda_5$.

Here, a conventional diode having the broad wavelength range mentioned in (1) above will be described using a Japanese Laid-open Patent Application Hei 6-283824 as an example.

The active region of the laser diode of the Application is constituted with a light containment layer, a plural number of quantum well layers, and barrier layers placed among the quantum well layers and in contact with them. At least one of the plural number of quantum well layers is different in thickness from the others and with lattice non-alignment. And an embodiment is disclosed which amplifies wavelength from 1.45–1.54 $\mu$m in the 1.5 $\mu$m band by adjusting the layer thickness and amount of distortion of the plural number of quantum well layers.

Next, the laser diode having two peaks in the output signal generation efficiency mentioned in (2) above will be described.

Figure 7:
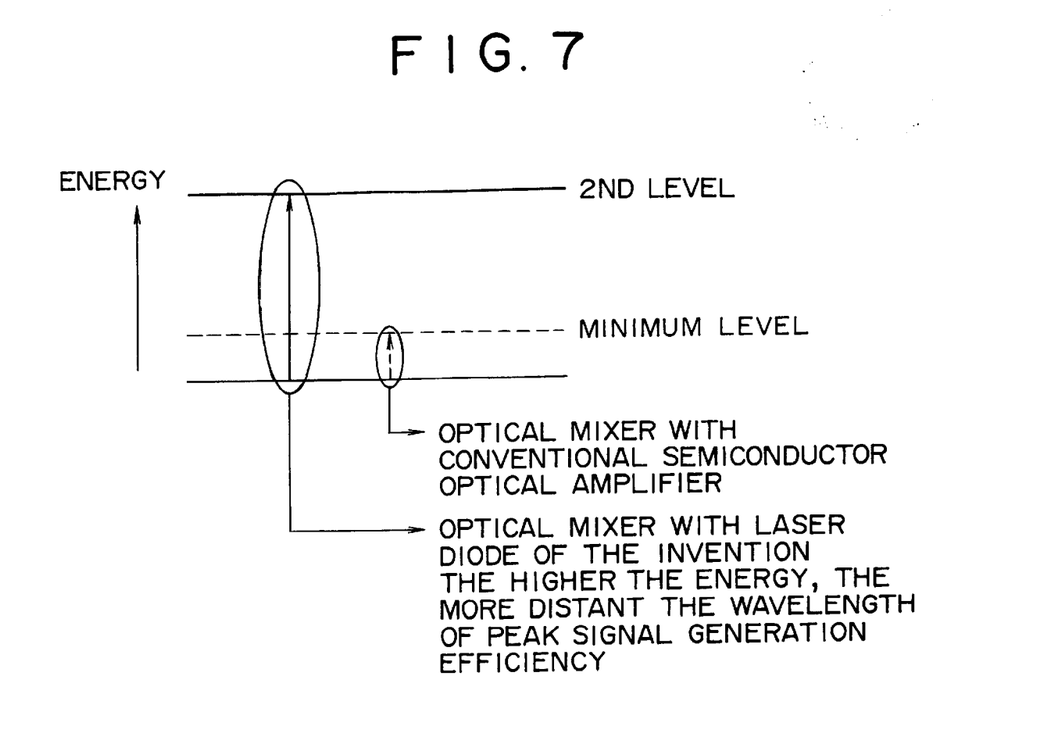
FIG. 7 is for describing the energy levels of a laser diode used in a mixer section for use in the embodiment of the invention.

In order that the diode has two peaks in the output signal generation efficiency, as shown in FIG. 7, energy is accumulated to a higher energy level than that of conventional laser diode by increasing the carrier injection, and mixing and amplification are carried out.

When the reflectivity of end surface mirrors 21 is kept low, which will be described later in reference to FIG. 8, energy loss increases and OPD does not oscillate unless a larger energy is injected than that with the conventional laser diode. The increased energy increases the distance between the two wavelength.

The higher the energy level, the higher the output signal generation efficiency at a wavelength distant from the original peak. As shown in FIG. 2(b), the laser diode having the second peak is made with the second output signal generation efficiency peak at $\lambda_5$ by adjusting the layer thickness to agree with the wavelength at the time of manufacture.

That is to say, the laser diode having a plural number of layers is made of a wide band type by adjusting each layer thickness so that one wavelength has its signal generation efficiency peak at a low level and the other at the second level.

Generally with the pn junction type of laser diode, the energy gap Eg between the conduction band and the valence band, and the frequency $\nu$ are in the relationship $h\nu=Eg$, where h is the Planck's constant. Therefore, the energy gap Eg is adjusted by adjusting the pn juction layer thickness so that the wavelength of the light outputted from the laser diode becomes $\lambda_5$.

With the ordinary laser diode, the reflection factor of the end surface mirrors is made less than $1/1000$ and carrier is injected. When energy is accumulated and reaches the minimum level, OPD amplifies the signal and oscillates. With the laser diode of this embodiment, however, the reflectivity of the end surface mirrors 21 shown in FIG. 8 is kept as low as $1/1000$–$1/100,000$ to raise the amplification-oscillation threshold so that OPD oscillates when the energy reaches the second level at an intended layer as shown in FIG. 9.

Next, a quantum well laser diode appropriate for the mixer section 2 will be described in reference to FIGS. 7 and 8.

The quantum well laser diode uses two types of alternately laminated composition materials for the active layer.

Figure 8:
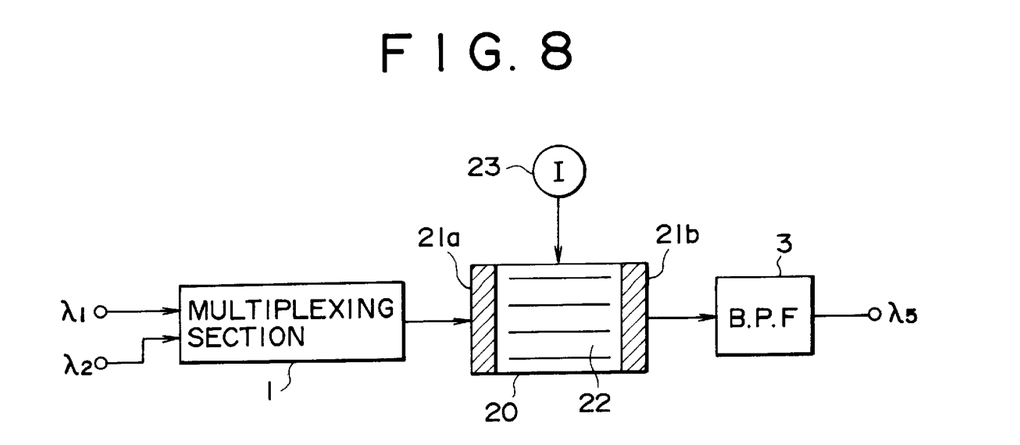
FIG. 8 is a block diagram of an embodiment of the invention with a mixer section using a quantum well type of laser diode.
Figure 9:
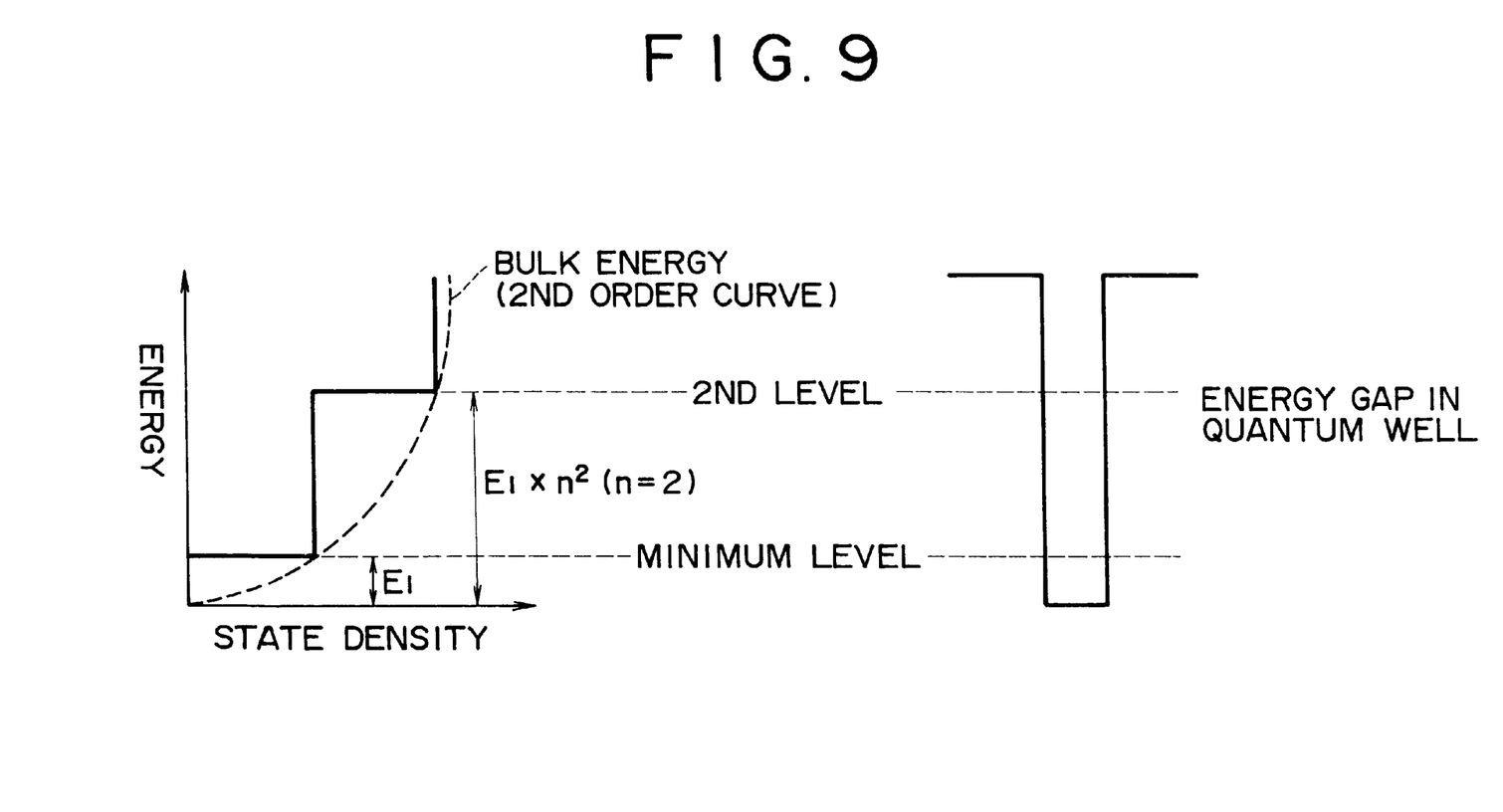
FIG. 9 shows the density of states of the quantum well type of laser diode shown in FIG. 8.

One shown in FIG. 8 uses a quantum well laser diode 20 as the mixer section 2 shown in FIG. 1.

Figure 10:
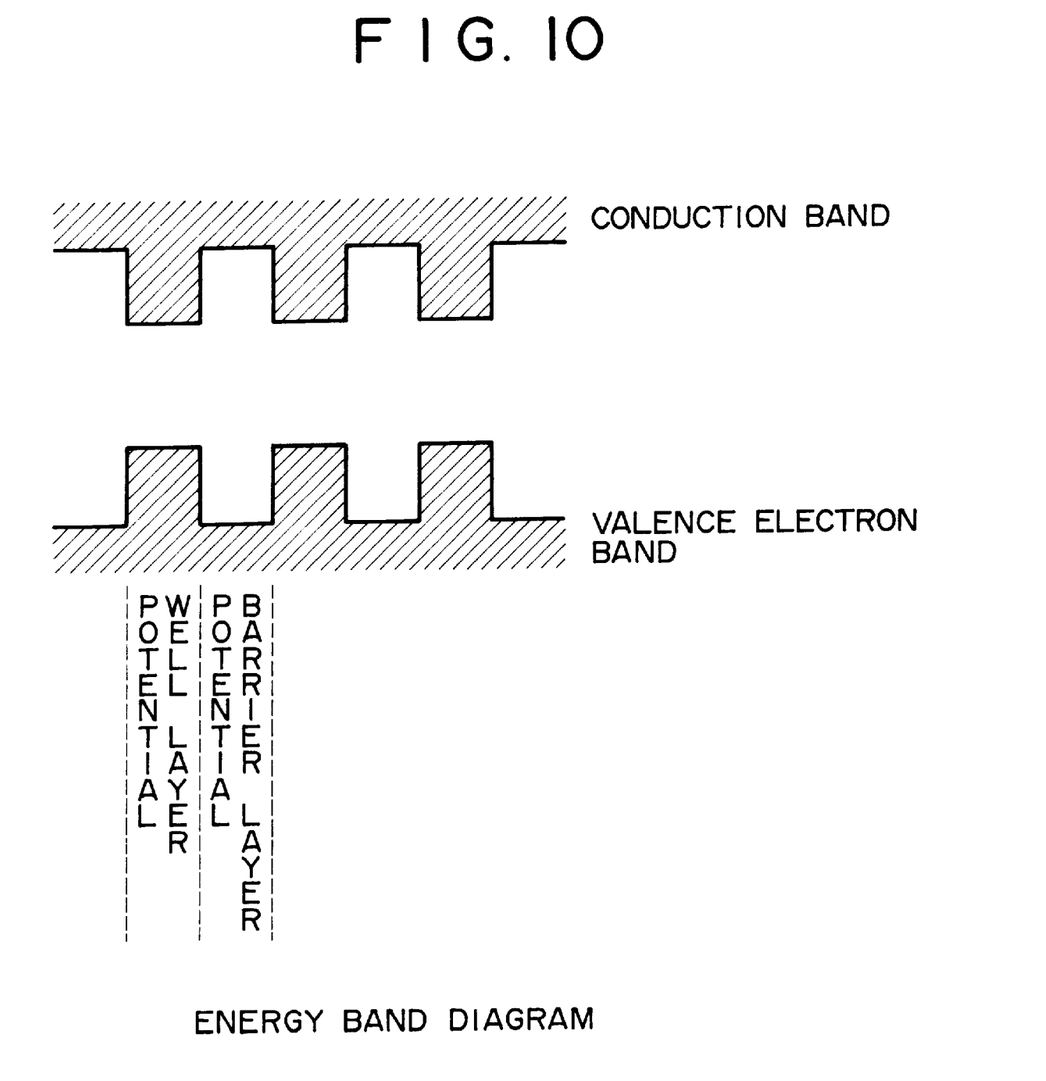
FIG. 10 shows the energy band of the quantum well type of laser diode shown in FIG. 8.

The quantum well laser diode 20 as shown in FIG. 8 is provided with end surface mirrors 21a, 21b on both ends between which is disposed an active layer consisting of two types of composition materials stacked alternately in heterojunction quantum well structure 22. The symbol 23 denotes a carrier injection power source. FIG. 10 shows the energy band of the quantum well laser diode 20.

With the quantum well laser diode in which very thin films of two different materials are alternately laminated, electrons are stable at a low energy level. As a result, electrons may be locally distributed in the potential well layer where the energy of the conduction band bottom is low. The potential barrier layer becomes a barrier because of its high energy of the conduction band bottom. Since only the number of waves which become a standing wave are allowed to the electrons bound to the potential well layer, the wavelength is determined with the layer thickness. Therefore, the layer thickness should be adjusted to obtain the light of the intended wavelength.

With the quantum well laser diode 20, electrons are stable at a low energy level. When energy is gradually injected, the energy collects in the potential well layer as shown in FIG. 10, and generally when the layer is saturated, oscillation begins. Since the reflection factor of the end surface mirrors 21a, 21b is kept as low as about $1/10,000$, this quantum well laser diode does not oscillate here but oscillates when the energy reaches the next level.

It is also possible to form the potential well layer in multiple layers with some layers in different thicknesses and different energy levels so as to cause oscillation in a plural number of wavelengths.

The state density of the above arrangement as shown in FIG. 9 occurs in stepped values. Carrier is injected to accumulate energy to the second level and oscillate. Here, since energy value is four times that of the minimum level, the wavelength may be set more widely apart than that of wavelength adjustment with a normal layer thickness.

The energy band structure of the quantum well laser is as shown in FIG. 10 and oscillation tends to occur with energy gap between the lowest of the conduction band of the potential well layer and the highest of the valence electron band. However, due to the quantum effect, electrons cannot exist in the potential well layer at the lowest energy of the conduction band, and can only exist when a standing wave occurs in the potential well layer. The energy level when the number of waves in the standing wave is minimum is called the minimum level. When the number of waves in the standing wave increases, the energy level that electrons can take becomes $n^2$ times the minimum level. Likewise, in the valence electron band, the energy level that the hole can take is only that when the standing wave is generated, and the value is $n^2$ times the minimum level.

For example, it is assumed that the thickness of the potential well layer and the potential barrier layer is 1 micrometers, and the energy gap of the potential barrier layer is 0.24 eV on the valence electron band side and 1.35 eV on the conduction band side, and the wavelength due to the energy gap Eg between the minimum energy in the potential well layer of the conduction band and the maximum energy in the valence band is 1600 nm. In that case, the energy at the minimum level corresponds to the wavelength 30 nm on the conduction band side and 5 nm on the valence band side. Therefore, oscillation wavelengths at the minimum and the second levels are respectively, (Minimum level oscillation): 1600−(30+5)=1565 nm (Second level oscillation) : 1600−(30×2²+5×2²)=1460 nm In this way, wavelength setting is made possible in a wider range than with the conventional layer thickness adjustment at the minimum level, even when the probe light wavelength $\lambda_1$, the pumping light wavelength $\lambda_2$, and the output signal of the wavelength $\lambda_5$ are apart from each other.

The output spectrum of the mixer section 2 using the quantum well type of laser diode is shown in FIG. 2(a) and FIG. 11. When the probe light wavelength $\lambda_1$=1553 nm, and pumping light wavelength $\lambda_2$=1548 nm are inputted and an output is taken out with n=2, the output wavelength $\lambda_5$ is 1538 nm. Thus, it is known that unnecessary wavelength output such as the pumping light of the wavelength $\lambda_2$=1548 nm is removed with the filter band of about 3 nm or less.

The signal generation efficiency when the multiple layer quantum well type of laser diode described above is used as the mixer 2 is shown in FIG. 2(b). As shown, it is possible to set the peak resulting from the two input wavelengths $\lambda_1$, $\lambda_2$ with a slight shift toward $\lambda_5$ to produce a peak resulting from the second level at the wavelength $\lambda_5$.

This optical parametric diffuser may be used for example in optical sampling observation of the output wavelength $\lambda_5$ converted from the probe light wavelength $\lambda_1$ with the pumping light in pulses.

The above embodiment is described in the case in which the pumping light wavelength $\lambda_2$ is shorter than the probe light wavelength $\lambda_1$ and the output wavelength $\lambda_5$ is shorter than the pumping light wavelength $\lambda_2$. However, it is a matter of course that this invention may also be applied to the case in which the pumping light wavelength $\lambda_2$ is longer than the probe light wavelength $\lambda_1$ and the output wavelength $\lambda_5$ is longer than the pumping light wavelength $\lambda_2$ by interchanging the peak of the gain of the mixer section resulting from the minimum level and the peak of the gain of the mixer section resulting from the second level.

This invention makes it possible to cut off an input signal easily by utilizing an output wavelength $\lambda_5$ which is apart from the input signal by n$\Delta\lambda$ (n is any integer not less than 2).

Also, since two peaks in signal generation efficiency of the laser diode are provided at the pumping light wavelength $\lambda_2$ and output wavelength $\lambda_5$, influence from the output wavelength $\lambda_4$ apart form the input signal by $\Delta\lambda$ is minimized.

Furthermore, the apparatus is made more compact than that using a KTP crystal and with an extremely high conversion efficiency ($10^{-2}$ or more).

What is claimed is:

1. An optical parametric diffuser comprising:

a multiplexing section for receiving a probe light of a wavelength $\lambda_1$ and a pumping light of a wavelength $\lambda_2$ and multiplexing said probe light and said pumping light;

a mixer section for receiving an output from said multiplexing section to produce a multiplexed output including a wavelength $\lambda_5$ represented by:

$$\lambda_5=(1+n)\lambda_2-n\lambda_1$$

wherein n is an integer of at least 2; and a band-pass filter for receiving an output from said mixer section and selectively outputting a multiplexed output of said wavelength $\lambda_5$.

2. An optical parametric diffuser as claimed in claim 1, wherein said mixer section comprises a laser diode having two peaks in signal generation efficiency at said pumping light wavelength $\lambda_2$ and said multiplexed output wavelength $\lambda_5$.

3. An optical parametric diffuser as claimed in claim 1, wherein said mixer section is a quantum well laser diode having two peaks in signal generation efficiency at said pumping light wavelength $\lambda_2$ and said multiplexed output wavelength $\lambda_5$.

4. An optical parametric diffuser as claimed in claim 3, wherein said quantum well laser diode comprises a multiple layer quantum well structure and an end surface mirror provided on each of the both ends of said multiple layer quantum well structure, wherein at least one layer of said multiple layer quantum well structure has a different layer thickness and a different quantum well energy level from those of the other layers, and wherein the reflectivity of each of said end surface mirrors is $1/1000$ to $1/10,000$.

5. A method for generating a multiplexed light of a wavelength $\lambda_5$ comprising:

multiplexing a probe light of a wavelength $\lambda_1$ and a pumping light of a wavelength $\lambda_2$;

mixing the multiplexed probe light and pumping light to produce a multiplexed output including the wavelength $\lambda_5$ represented by:

$$\lambda_5=(1+n)\lambda_2-n\lambda_1$$

wherein n is an integer of at least 2; and filtering the multiplexed output to selectively output the multiplexed light of wavelength $\lambda_5$.

* * * * *